US009515189B2

(12) United States Patent
Wenxu et al.

(10) Patent No.: US 9,515,189 B2
(45) Date of Patent: Dec. 6, 2016

(54) SEMICONDUCTOR DEVICE AND MANUFACTURING METHOD OF SEMICONDUCTOR DEVICE USING METAL OXIDE

(71) Applicant: Samsung Electronics Co., Ltd., Suwon-si, Gyeonggi-do (KR)

(72) Inventors: Xianyu Wenxu, Suwon-si (KR); Woo-young Yang, Hwaseong-si (KR); Chang-youl Moon, Suwon-si (KR); Yong-young Park, Daejeon (KR); Jeong-yub Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/879,423

(22) Filed: Oct. 9, 2015

(65) Prior Publication Data
US 2016/0035898 A1   Feb. 4, 2016

Related U.S. Application Data

(63) Continuation of application No. 13/949,588, filed on Jul. 24, 2013, now Pat. No. 9,184,052.

(30) Foreign Application Priority Data

Oct. 25, 2012  (KR) .......... 10-2012-0119303
Oct. 29, 2012  (KR) .......... 10-2012-0120623

(51) Int. Cl.
H01L 29/786    (2006.01)
H01L 29/04     (2006.01)
(Continued)

(52) U.S. Cl.
CPC ... *H01L 29/78603* (2013.01); *H01L 21/02381* (2013.01); *H01L 21/02422* (2013.01);
(Continued)

(58) Field of Classification Search
None
See application file for complete search history.

(56) References Cited

U.S. PATENT DOCUMENTS 7,390,727 B2   6/2008  Jang et al.
7,439,116 B2  10/2008  Jang et al.
(Continued)

FOREIGN PATENT DOCUMENTS

KR   20100100187 A    9/2010
KR      101117643 B1  10/2011

OTHER PUBLICATIONS

You-Da Lin, "Effects of Oxygen in Ni Films on Ni-Induced Lateral Crystallization of Amorphous Silicon Films at Various Temperatures", Journal of Electronic Materials, vol. 35, No. 9, pp. 1708-1711, 2006.
(Continued)

*Primary Examiner* — Khaja Ahmad
(74) *Attorney, Agent, or Firm* — Harness, Dickey & Pierce, P.L.C.

(57) ABSTRACT

A method of manufacturing a semiconductor device using a metal oxide includes forming a metal oxide layer on a substrate, forming an amorphous semiconductor layer on the metal oxide layer, and forming a polycrystalline semiconductor layer by crystallizing the amorphous semiconductor layer using the metal oxide layer.

7 Claims, 10 Drawing Sheets

(51) Int. Cl.
*H01L 29/16* (2006.01)
*H01L 29/161* (2006.01)
*H01L 29/45* (2006.01)
*H01L 21/02* (2006.01)
*H01L 29/66* (2006.01)
*H01L 29/868* (2006.01)

(52) U.S. Cl.
CPC .. *H01L 21/02488* (2013.01); *H01L 21/02532* (2013.01); *H01L 21/02595* (2013.01); *H01L 21/02672* (2013.01); *H01L 29/04* (2013.01); *H01L 29/045* (2013.01); *H01L 29/16* (2013.01); *H01L 29/161* (2013.01); *H01L 29/45* (2013.01); *H01L 29/458* (2013.01); *H01L 29/66136* (2013.01); *H01L 29/66757* (2013.01); *H01L 29/66765* (2013.01); *H01L 29/78672* (2013.01); *H01L 29/78675* (2013.01); *H01L 29/78678* (2013.01); *H01L 29/78684* (2013.01); *H01L 29/868* (2013.01)

(56) References Cited

U.S. PATENT DOCUMENTS

| | | | |
|---|---|---|---|
| 8,101,480 | B1 | 1/2012 | Kim et al. |
| 8,120,029 | B2 | 2/2012 | Park et al. |
| 2008/0268622 | A1* | 10/2008 | Van Gestel ....... H01L 21/02422 |
| | | | 438/486 |
| 2008/0296565 | A1* | 12/2008 | Park .................. H01L 29/66757 |
| | | | 257/40 |
| 2009/0189160 | A1 | 7/2009 | Ahn et al. |
| 2010/0062555 | A1 | 3/2010 | Hwang et al. |
| 2010/0072480 | A1* | 3/2010 | Yoo .................. H01L 29/78696 |
| | | | 257/66 |
| 2011/0034009 | A1* | 2/2011 | Hayakawa ......... H01L 21/2026 |
| | | | 438/487 |
| 2012/0061675 | A1 | 3/2012 | Yamamoto |

OTHER PUBLICATIONS

Byung-Soo So, "Crystallization of Amorphous Silicon Thin Films Using Self-Limiting ALD of Nickel Oxide", Electrochemical and Solid-State Letters, vol. 10, No. 5, pp. J61-J64, 2007.

* cited by examiner

SEMICONDUCTOR DEVICE AND MANUFACTURING METHOD OF SEMICONDUCTOR DEVICE USING METAL OXIDE

CROSS-REFERENCE TO RELATED APPLICATIONS

This application is a continuation application of U.S. application Ser. No. 13/949,588, filed on Jul. 24, 2013, which claims the benefit of Korean Patent Applications No. 10-2012-0119303, filed on Oct. 25, 2012, and No. 10-2012-0120623, filed on Oct. 29, 2012, in the Korean Intellectual Property Office, the entire contents of each of which are incorporated herein by reference.

BACKGROUND

1. Field

Some example embodiments relate to semiconductor devices and methods of manufacturing a semiconductor device using a metal oxide.

2. Description of the Related Art

An amorphous silicon layer has higher field effect mobility, can be applied to a high-speed operating circuit, and may be used to fabricate a complementary metal-oxide semiconductor (CMOS) circuit. Thus, the amorphous silicon layer has been widely used to form a semiconductor layer of a semiconductor device, such as a thin film transistor (hereinafter referred to as a 'TFT') or a diode.

Polycrystalline silicon may be formed through direct evaporation or may be formed by crystallizing an amorphous silicon layer into polycrystalline silicon. A method of forming polycrystalline silicon through direct evaporation is the most direct and a relatively easy method. However, when polycrystalline silicon is formed using this method, particles are generally smaller, have many defects and the quality of the polycrystalline silicon is not desirable, thereby deteriorating the performance of a polycrystalline silicon TFT.

Amorphous silicon may be crystallized according to a laser crystallization method, a thermal crystallization method, a complex crystallization method, or the like. In the laser crystallization method, amorphous or polycrystalline silicon is melted and recrystallized using a pulse laser or continuous laser. Thus, polycrystalline silicon having a few defects in particles may be formed. In the thermal crystallization method, a crystallization temperature is generally lowered using metal catalyst or complex energy. In a solid-phase crystallization method of forming low-temperature polycrystalline silicon by thermally treating amorphous silicon at a temperature around 600° C., the crystallization temperature is relatively high to cause a glass substrate to be bent and to change in size. Thus, the solid-phase crystallization method is difficult to apply to a manufacturing process.

Methods using metal catalyst may be divided into metal induced crystallization (MIC) and metal induced lateral crystallization (MILC). When a method of crystallizing polysilicon using a metal catalyst is used, a nickel (Ni) catalyst may remain in a polysilicon layer and a relatively large amount of leakage current may thus be generated during the manufacture of a silicon TFT.

SUMMARY

Some example embodiments provide methods of manufacturing a semiconductor device using a metal oxide. Some example embodiments also provide semiconductor devices capable of reducing metallic pollution using a metal oxide.

Additional aspects will be set forth in part in the description which follows and, in part, will be apparent from the description, or may be learned by practice of the presented embodiments.

According to an example embodiment, a method of manufacturing a semiconductor device includes forming a metal oxide layer on a substrate, forming an amorphous semiconductor layer on the metal oxide layer, and forming a polycrystalline semiconductor layer by crystallizing the amorphous semiconductor layer using the metal oxide layer.

The metal oxide layer may include at least one of NiO, CuO, ZnO, SnO, $AlO_x$, $TiO_x$, $InO_x$, $GaO_x$, $PbO_x$, and $CoO_x$. The metal oxide layer may be formed using one of an atomic layer deposition and a plasma-enhanced atomic layer deposition. The method may further include forming an insulating layer between the substrate and the metal oxide layer. The insulating layer may be formed of one of $SiO_2$ and $SiN_x$, wherein $0<x<1$.

One of a metal silicide and a metal germanide may be formed on a surface of the polycrystalline semiconductor layer. The substrate may be one of a glass substrate and a silicon substrate. The amorphous semiconductor layer may include one of a-Si, a-Ge, and $a-Si_{1-x}Ge_x$.

The method may further include forming a gate electrode between the substrate and the insulating layer, forming a metal layer on the polycrystalline semiconductor layer, and forming source and drain electrodes by etching a portion of the metal layer to expose the polycrystalline semiconductor layer.

One of a metal silicide and a metal germanide may be formed between the polycrystalline semiconductor layer and the metal layer. The amorphous semiconductor layer may include an intrinsic amorphous semiconductor layer, and one of an n-type amorphous semiconductor layer and a p-type amorphous semiconductor layer.

The method may further include forming a gate electrode region by etching the polycrystalline semiconductor layer, forming an insulating layer on the polycrystalline semiconductor layer, forming a gate electrode in the gate electrode region, forming a protective layer on the gate electrode and the insulating layer, and forming a source electrode and a drain electrode by etching the protective layer.

A metal layer may be formed on the polycrystalline semiconductor layer. One of a metal silicide and a metal germanide may be formed on the polycrystalline semiconductor layer and the metal layer.

The polycrystalline semiconductor layer may have an (111) crystallization orientation. The polycrystalline semiconductor layer may include a grain having a diameter that is greater than 0 and less than or equal to 50 nm.

According to another example embodiment, a semiconductor device includes a polycrystalline semiconductor layer on a substrate, and a metal silicide on the polycrystalline semiconductor layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1A:
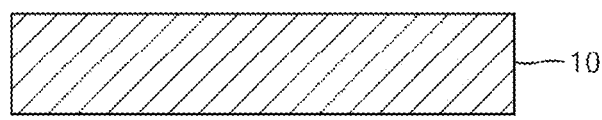
FIGS. 1A to 1E are cross-sectional views illustrating a method of manufacturing a semiconductor device according to an example embodiment.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, expressions such as "at least one of," when preceding a list of elements, modify the entire list of elements and do not modify the individual elements of the list.

Hereinafter, semiconductor devices and methods of manufacturing a semiconductor device using a metal oxide according to various example embodiments will be described in detail with reference to the accompanying drawings. The same reference numerals represent the same elements throughout the drawings. In the drawings, the thickness of layers and regions may be exaggerated for clarity. The embodiments set forth herein are just illustrative and the inventive concepts may be embodied in many different forms. It will be understood that when an element or layer is referred to as being 'on' another element or layer, the element or layer can be directly on another element or layer or intervening elements or layers.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
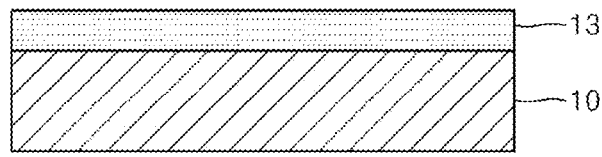

FIGS. 1A to 1E are cross-sectional views illustrating a method of manufacturing a semiconductor device according to an example embodiment. Referring to FIGS. 1A and 1B, an insulating layer 13 is formed on a substrate 10. The substrate 10 may be, for example, a glass substrate or a silicon substrate. The insulating layer 13 may be, for example, $SiO_2$ or $SiN_x$ (0<x<1). The insulating layer 13 may be selectively formed.

Figure 1C:
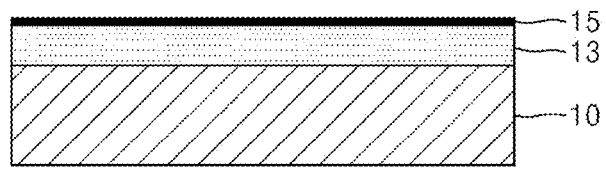

Referring to FIG. 1C, a metal oxide layer 15 is formed on the insulating layer 13. The metal oxide layer 15 may include, for example, at least one selected from the group consisting of NiO, CuO, ZnO, SnO, $AlO_x$, $TiO_x$, $InO_x$, $GaO_x$, $PbO_x$, and $CoO_x$, wherein 0<x<1. The metal oxide layer 15 may act as a catalyst for inducing crystallization of an amorphous semiconductor layer. Also, the metal oxide layer 15 has insulating properties.

The metal oxide layer 15 may be formed using sputtering, plasma-enhanced chemical vapor deposition, ion beam deposition, electron beam deposition, atomic layer deposition, plasma-enhanced atomic layer deposition, or the like. When the metal oxide layer 15 is formed using atomic layer deposition or plasma-enhanced atomic layer deposition, the metal oxide layer 15 may be formed to a uniform thickness and may be formed in a mono layer.

Figure 1D:
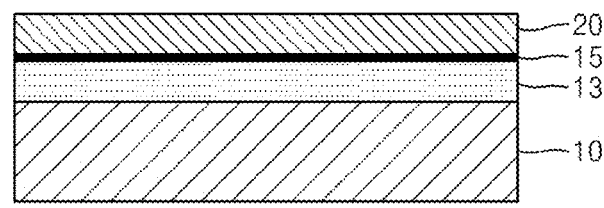
Figure 1E:
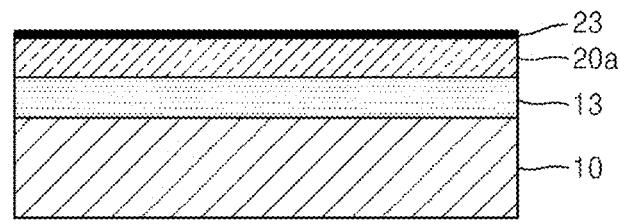

Referring to FIG. 1D, an amorphous semiconductor layer 20 is formed on the metal oxide layer 15. The amorphous semiconductor layer 20 may be formed of, for example, amorphous silicon (Si) or amorphous germanium (Ge). The amorphous semiconductor layer 20 may be formed in a single layer form or a multiple layer form. For example, the amorphous semiconductor layer 20 may be formed to include only an amorphous silicon layer or may be formed to include two layers, e.g., an amorphous intrinsic silicon layer and an n-type amorphous silicon layer. The metal oxide layer 15 and the amorphous semiconductor layer 20 are thermally treated. The thermal process may be, for example, a furnace process, a rapid thermal annealing (RTA) process, an excimer laser annealing (ELA) process, or the like. Through the thermal process, metal in the metal oxide layer 15 may be diffused into the amorphous semiconductor layer 20. A metal silicide or metal germanide formed from a combination of the metal in the metal oxide layer 15 and a semiconductor in the amorphous semiconductor layer 20 may form a seed that is a nucleus for crystallization. The amorphous semiconductor layer 20 may be crystallized into a polycrystalline semiconductor layer 20a using the seed as shown in FIG. 1E. For example, when the metal oxide layer 15 is formed of NiO and the amorphous semiconductor layer 20 is formed of amorphous silicon, these layers may react as follows:

$$NiO + Si \rightarrow SiO_2 + Ni \qquad \text{<Equation 1>}$$

Also, through thermal treatment, Ni of NiO is diffused into the amorphous silicon layer and is then combined with silicon to form $NiSi_2$, and $NiSi_2$ acts as a seed to crystallize the amorphous semiconductor layer 20. Also, as illustrated in FIG. 1E, a metal silicide/metal germanide 23 (hereinafter referred to as 'metal silicide') may be formed on a surface of the polycrystalline semiconductor layer 20a.

The metal oxide layer 15 may have, for example, a thickness of 5 nm or less. Otherwise, the metal oxide layer 15 may have, for example, a thickness of 2 nm or less. When the metal oxide layer 15 has a relatively thin thickness, the amorphous semiconductor layer 20 may be more easily crystallized. When the metal silicide 23 is formed on the polycrystalline silicon layer 20a, a contact resistance between a stacked structure that is to be formed on the polycrystalline silicon layer 20a and the polycrystalline silicon layer 20a may be reduced, as will be described in detail below.

As in the current embodiment, when an amorphous semiconductor layer is crystallized using a metal oxide, a problem caused due to a metal silicide remaining on a polycrystalline semiconductor layer may be reduced. Also, even if a metal oxide remains below the polycrystalline semiconductor layer after the crystallization of the amorphous semiconductor layer is completed, the metal oxide is present as an insulator, thereby preventing or inhibiting metallic pollution from occurring. When the amorphous semiconductor layer is crystallized using a metal layer, instead of the metal oxide, the amorphous semiconductor layer may be difficult to crystallize.

When the metal layer remains after the crystallization of the amorphous semiconductor layer, current may leak via the metal layer, thereby causing a semiconductor device to malfunction. However, when the metal oxide is used, such a problem may be prevented or inhibited.

Figure 2A:
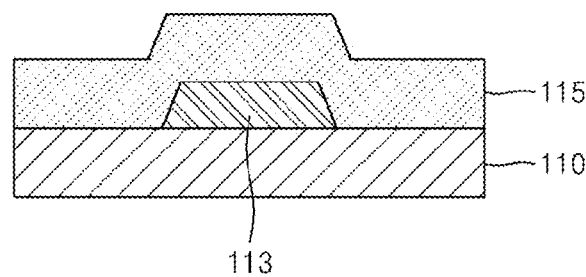
FIGS. 2A to 2F are cross-sectional views illustrating a method of manufacturing a semiconductor device according to another example embodiment.

A method of manufacturing a semiconductor device according to another example embodiment will be described above with reference to FIGS. 2A to 2F. Referring to FIG. 2A, a metal layer (not shown) is formed on a substrate 110 and is patterned to obtain a gate electrode 113. The metal layer used for a gate electrode may include, for example, at least one selected from the group consisting of aluminum (Al), chromium (Cr), and molybdenum (Mo). An insulating layer 115 may be formed on the substrate 110 and the gate electrode 113. The substrate 110 may be a glass substrate or a silicon substrate. The insulating layer 115 may be formed of, for example, $SiO_2$, $SiN_x$, $AlO_x$, or a high-k material.

Figure 2B:
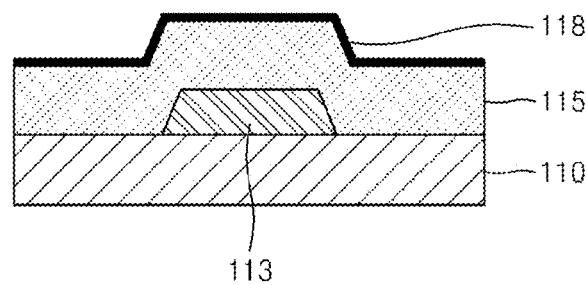

Referring to FIG. 2B, a metal oxide layer 118 is formed on the insulating layer 115. The metal oxide layer 118 may include, for example, at least one selected from the group consisting of NiO, CuO, ZnO, SnO, $AlO_x$, $TiO_x$, $InO_x$, $GaO_x$, $PbO_x$, and $CoO_x$, wherein $0<x<1$. The metal oxide layer 118 may be formed using sputtering, plasma-enhanced chemical vapor deposition, ion beam deposition, electron beam deposition, atomic layer deposition, or plasma-enhanced atomic layer deposition.

Figure 2C:
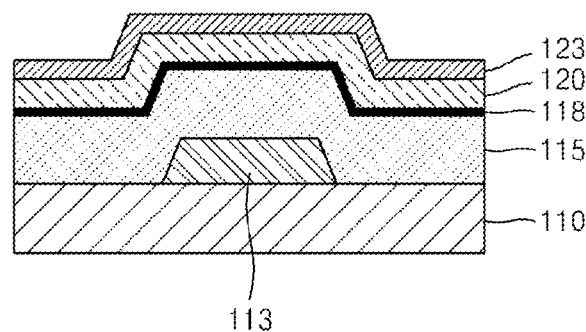

Referring to FIG. 2C, an intrinsic amorphous semiconductor layer 120 and an n-type amorphous semiconductor layer 123 may be formed on the metal oxide layer 118. An n-type dopant may include, for example, at least one selected from the group consisting of P, Sb, and As. The intrinsic amorphous semiconductor layer 120 may be formed of, for example, an intrinsic amorphous silicon layer or an intrinsic amorphous germanium layer.

Figure 2D:
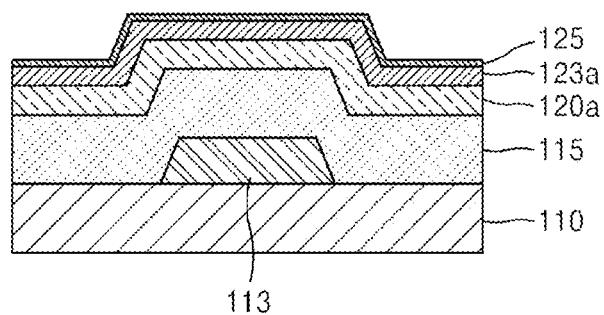

Referring to FIG. 2D, the intrinsic amorphous semiconductor layer 120 and the n-type amorphous semiconductor layer 123 are crystallized according to a thermal treatment process to form an intrinsic polycrystalline semiconductor layer 120a and an n-type polycrystalline semiconductor layer 123a. The thermal treatment process may be performed, for example, at about 450 to 550° C. During the polycrystallization process, a metal silicide/metal germanide 125 (hereinafter referred to as 'metal silicide 125') may be formed on the n-type polycrystalline semiconductor layer 123a. The meta silicide 125 may be produced when the metal oxide 118 and an amorphous semiconductor layer react with each other.

Figure 2E:
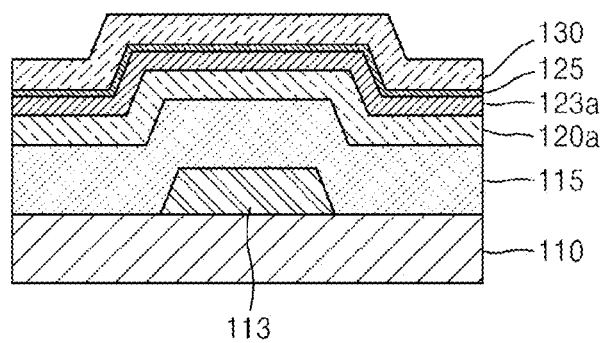
Figure 2F:
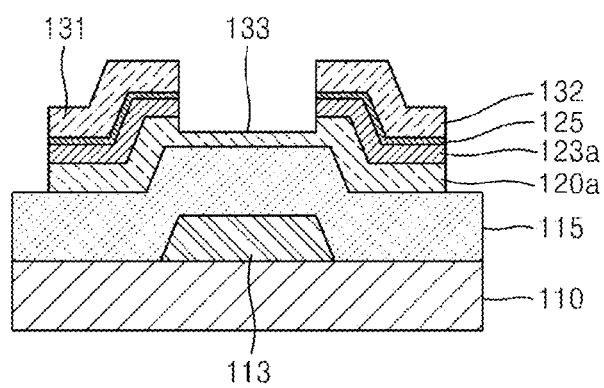

Referring to FIG. 2E, a metal layer 130 is formed on the metal silicide 125. Referring to FIG. 2F, the metal layer 130 is patterned and etched to expose the intrinsic polycrystalline semiconductor layer 120a. A region in which the intrinsic polycrystalline semiconductor layer 120a is exposed acts as a channel region 133. The channel region 133 may be present in a region corresponding to the gate electrode 113. By etching the metal layer 130, a source electrode 131 and a drain electrode 132 may be formed. The metal layer 130 may be formed of a material including at least one selected from the group consisting of Mo, Cr, W, Al—Nd, Ti, MoW, and Al. The intrinsic polycrystalline semiconductor layer 120a between the source electrode 131 and the drain electrode 132 may act as a channel.

The metal silicide 125 may be present between the n-type polycrystalline semiconductor layer 123a and the source electrode 131 and between the n-type polycrystalline semiconductor layer 123a and the drain electrode 132. The metal silicide 125 may reduce a contact resistance between the source electrode 131 and the n-type polycrystalline semiconductor layer 123a and between the drain electrode 132 and the n-type polycrystalline semiconductor layer 123a. When a semiconductor device is manufactured using a metal oxide, the semiconductor device has relatively high crystallizability and a thin film having a uniform thickness.

A polycrystalline semiconductor layer according to an example embodiment may have a particular (or, alternatively preferred) (111) crystallization orientation. Also, in the polycrystalline semiconductor layer, a degree of uniformity of a crystalline grain is relatively high. For example, most of the crystalline grains may each have a uniform diameter that is greater than '0' and less than or equal to 50 nm. A semiconductor device illustrated in FIG. 2F may be applied to, for example, a bottom gate type thin film transistor (TFT).

A method of manufacturing a semiconductor device according to another example embodiment will be described with reference to FIGS. 3A to 3J below.

Figure 3A:
FIGS. 3A to 3J are cross-sectional views illustrating a method of manufacturing a semiconductor device according to another example embodiment.
Figure 3B:
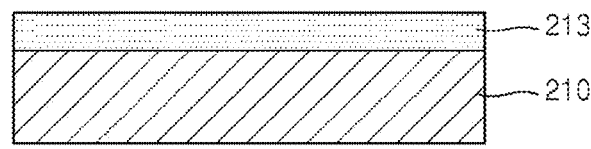

Referring to FIGS. 3A and 3B, an insulating layer 213 is formed on a substrate 210. The substrate 210 may be, for example, a glass substrate or a silicon substrate. The insulating layer 213 may be formed of, for example, $SiO_2$ or $SiN_x$.

Figure 3C:
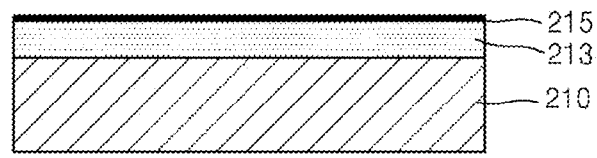

Referring to FIG. 3C, a metal oxide 215 may be formed on the insulating layer 213. The metal oxide layer 215 may include, for example, at least one selected from the group consisting of NiO, CuO, ZnO, SnO, $AlO_x$, $TiO_x$, $InO_x$, $GaO_x$, $PbO_x$, and $CoO_x$, wherein 0<x<1. The metal oxide layer 215 may be formed using sputtering, plasma-enhanced chemical vapor deposition, ion beam deposition, electron beam deposition, atomic layer deposition, or plasma-enhanced atomic layer deposition.

Figure 3D:
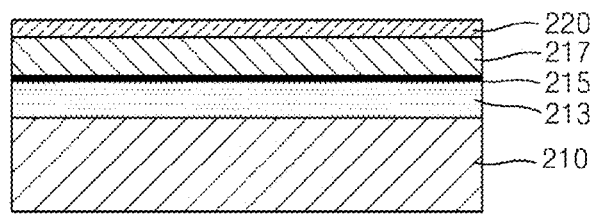

Referring to FIG. 3D, an intrinsic amorphous semiconductor layer 217 and an n-type amorphous semiconductor layer 220 may be formed on the metal oxide layer 215. The intrinsic amorphous semiconductor layer 217 may be formed of, for example, an intrinsic amorphous silicon layer, an intrinsic amorphous germanium layer, or an intrinsic $Si_{1-x}Ge_x$. The n-type amorphous semiconductor layer 220 may be formed of, for example, n-type amorphous silicon, an n-type amorphous germanium layer, or n-type $Si_{1-x}Ge_x$. The n-type impurities may include, for example, at least one selected from the group consisting of P, Sb, and As. Here, a p-type amorphous semiconductor layer may be formed instead of the n-type amorphous semiconductor layer 220.

Figure 3E:
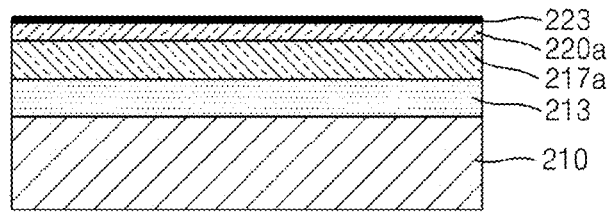

Referring to FIG. 3E, the intrinsic amorphous semiconductor layer 217 and the n-type amorphous semiconductor layer 220 may be crystallized through a thermal treatment process to obtain an intrinsic polycrystalline semiconductor layer 217a and an n-type polycrystalline semiconductor layer 220a. The thermal treatment process may be performed, for example, at about 450 to 550° C. A furnace process, a rapid thermal annealing (RTA) process, or an excimer laser annealing (ELA) process may be performed as the thermal treatment process.

During the polycrystallization process, a metal silicide/metal germanide 223 (hereinafter referred to as metal silicide 223) may be formed on the n-type polycrystalline semiconductor layer 220a. The metal silicide 223 may be produced when the metal oxide 215 and an amorphous semiconductor layer react with each other. During the polycrystalline process, the metal oxide 215 may be exhausted or partially remain. Even if the metal oxide 215 remains, an operation of a semiconductor device is not badly influenced by the metal oxide 215 since the metal oxide 215 acts as an insulator.

Figure 3F:
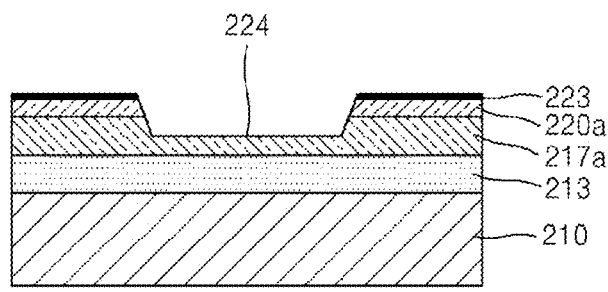

Referring to FIG. 3F, the intrinsic polycrystalline semiconductor layer 217a and the n-type polycrystalline semiconductor layer 220a are etched to form a channel region 224. The intrinsic polycrystalline semiconductor layer 217a may be etched to be exposed in the channel region 224.

Figure 3G:
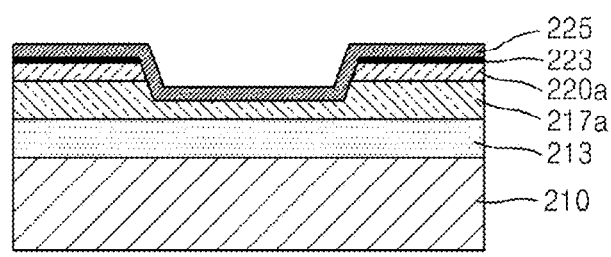
Figure 3H:
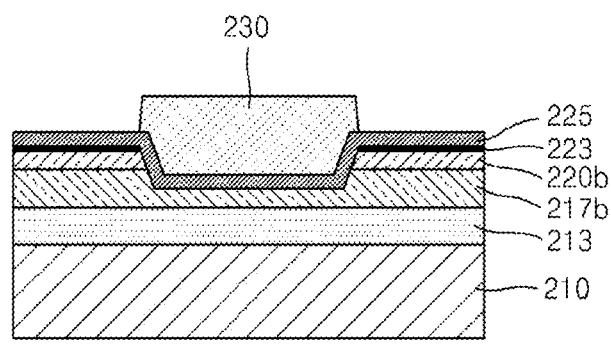
Figure 3I:
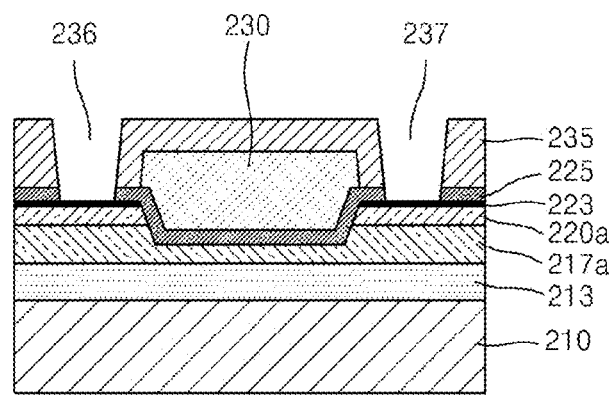

Referring to FIG. 3G, a gate insulating layer 225 may be formed in the channel region 224 and on the n-type polycrystalline semiconductor layer 220a. As illustrated in FIG. 3H, a gate electrode 230 may be formed over the channel region 224. The gate electrode 230 may be formed, for example, using a photolithographic process. Referring to FIG. 3I, a protective layer 235 may be formed on the resultant structure of FIG. 3H, and the protective layer 235 and the gate insulating layer 225 are etched to expose the metal silicide 223, thereby forming a source region 236 and a drain region 237.

Figure 3J:
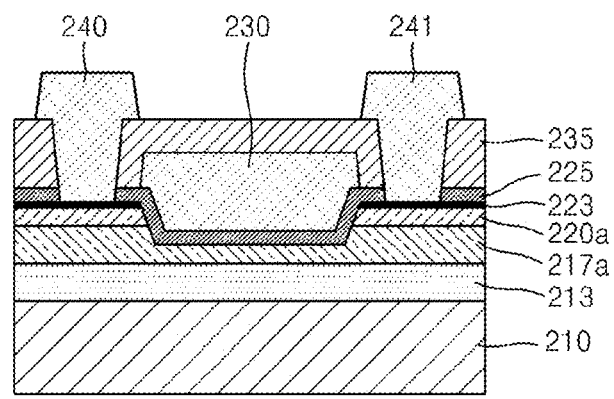

Referring to FIG. 3J, a metal layer (not shown) is formed on the protective layer 235, and a source electrode 240 and a drain electrode 241 are formed in the source region 236 and the drain region 237 using the photolithographic process, respectively.

Each of the source electrode 240 and the drain electrode 241 may be formed of a material including at least one selected from the group consisting of Mo, Cr, W, Al—Nd, Ti, MoW, and Al. A polycrystalline semiconductor layer between the source electrode 240 and the drain electrode 241 may act as a channel. The metal silicide 223 is between the n-type polycrystalline semiconductor layer 220a and the source electrode 240 and between the n-type polycrystalline semiconductor layer 220a and the drain electrode 241. The metal silicide 223 may reduce a contact resistance between the source electrode 240 and the n-type polycrystalline semiconductor layer 220a and between the drain electrode 241 and the n-type polycrystalline semiconductor layer 220a.

When a semiconductor device is manufactured using a metal oxide, the semiconductor device has relatively high crystallizability and a thin film having a uniform thickness. Even if the metal oxide is not exhausted and partially remains, the metal oxide may act as a gate insulating layer and an operation of a gate electrode is thus not much influenced by the metal oxide. Also, metal in the metal oxide acts as a catalyst to not only crystallize an amorphous semiconductor layer but also be formed as a metal silicide on the amorphous semiconductor layer. The metal silicide may reduce a contact resistance between a source electrode and a drain electrode. Thus, according to an example embodiment, it is possible to prevent or inhibit occurrence of problems caused by metallic pollution that may occur in the existing polycrystallization method using crystallization-induced metal.

A polycrystalline semiconductor layer according to an example embodiment may have a particular (or, alternatively preferred) (111) crystallization orientation. Also, in the polycrystalline semiconductor layer, a degree of uniformity of a crystalline grain is relatively high. For example, a crystalline grain may have a uniform diameter that is greater than '0' and less than or equal to 50 nm. Accordingly, crystallizability of the polycrystalline semiconductor layer may be improved. The semiconductor device illustrated in FIG. 3J may be applied to a top gate type TFT.

A method of manufacturing a semiconductor device according to another example embodiment will be described with reference to FIGS. 4A to 4F below.

Figure 4A:
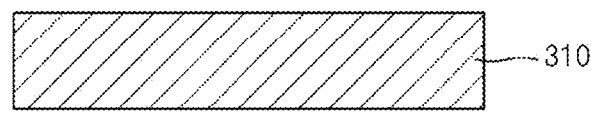
FIGS. 4A to 4F are cross-sectional views illustrating a method of manufacturing a semiconductor device according to another example embodiment.
Figure 4B:
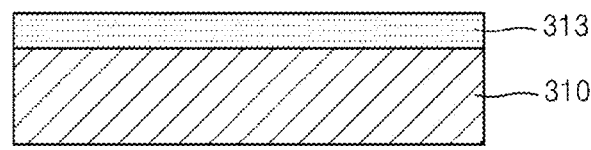

Referring to FIGS. 4A and 4B, a transparent conductive oxide (TCO) film 313 is formed on a substrate 310. The substrate 310 may be, for example, a glass substrate or a silicon substrate. The TCO film 313 may include, for example, ITO, ZnO, or $SnO_2$.

Figure 4C:
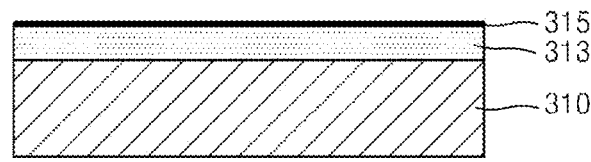

Referring to FIG. 4C, a metal oxide layer 315 may be formed on the TCO film 313. The metal oxide layer 315 may include, for example, at least one selected from the group consisting of NiO, CuO, ZnO, SnO, $AlO_x$, $TiO_x$, $InO_x$, $GaO_x$, $PbO_x$, and $CoO_x$, wherein 0<x<1. The metal oxide layer 315 may be formed using sputtering, plasma-enhanced chemical vapor deposition, ion beam deposition, electron beam deposition, atomic layer deposition, or plasma-enhanced atomic layer deposition. The metal oxide layer 315 may act as a catalyst for inducing crystallization of an amorphous semiconductor layer. Also, the metal oxide layer has insulating properties.

Figure 4D:
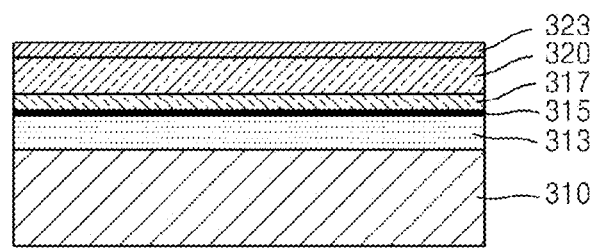

Referring to FIG. 4D, a plurality of amorphous semiconductor layers may be formed on the metal oxide layer 315. The plurality of amorphous semiconductor layers may include, for example, a p-type amorphous semiconductor layer 317, an intrinsic amorphous semiconductor layer 320, and an n-type amorphous semiconductor layer 323.

Otherwise, an order in which the p-type amorphous semiconductor layer 317 and the n-type amorphous semiconductor layer 323 are formed may be reversed. The p-type amorphous semiconductor layer 317 may be formed of, for example, p-type amorphous silicon, p-type amorphous germanium, or p-type $Si_{1-x}Ge_x$. The p-type impurities may include, for example, at least one selected from the group consisting of B, Al, Ga, and In.

The intrinsic amorphous semiconductor layer 320 may be formed of, for example, an intrinsic amorphous silicon layer, an intrinsic amorphous germanium layer, or intrinsic $Si_{1-x}Ge_x$. The n-type amorphous semiconductor layer 220 may be formed of, for example, n-type amorphous silicon, n-type amorphous germanium, or n-type $Si_{1-x}Ge_x$. The n-type impurities may include, for example, at least one selected from the group consisting of P, Sb, and As.

Figure 4E:
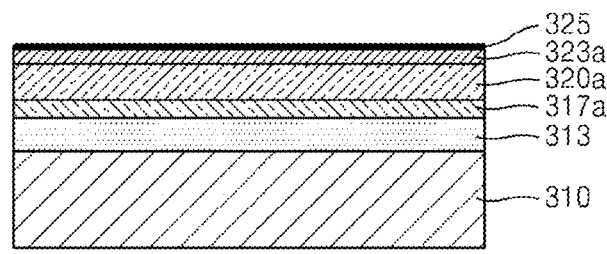

Referring to FIG. 4E, the p-type amorphous semiconductor layer 317, the intrinsic amorphous semiconductor layer 320, and the n-type amorphous semiconductor layer 323 are crystallized to obtain a p-type polycrystalline semiconductor layer 317a, an intrinsic polycrystalline semiconductor layer 320a, and an n-type polycrystalline semiconductor layer 323a according to a thermal treatment process, respectively. The thermal treatment process may be performed, for example, at about 450 to 550° C. A furnace process, a Rapid Thermal Annealing (RTA) process, or an Excimer Laser Annealing (ELA) process may be used as the thermal treatment process.

During the polycrystallization process, a metal silicide 325 may be formed on the n-type polycrystalline semiconductor layer 323a. The metal silicide 325 may be produced when the metal oxide 315 and an amorphous semiconductor layer react with each other. The metal silicide 325 may be, for example, $NiSi_2$ or $CuSi_2$.

Figure 4F:
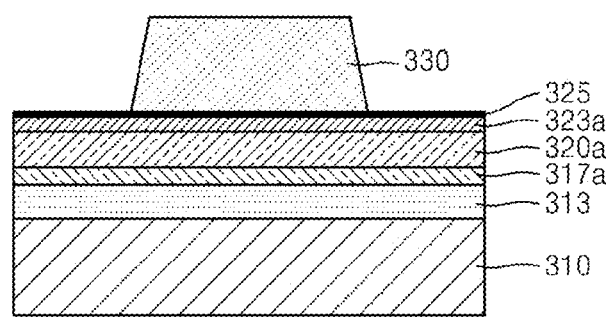

Referring to FIG. 4F, a metal layer (not shown) may be formed on the metal silicide 325 and may be patterned and etched to form an electrode 330. The metal silicide 325 is present between the electrode 330 and the n-type polycrystalline semiconductor layer 323a. The metal silicide 325 may reduce a contact resistance between the electrode 330 and the n-type polycrystalline semiconductor layer 323a. A semiconductor device illustrated in FIG. 4F may be applied to a pin diode.

As described above, in a method of manufacturing a semiconductor device according to example embodiments, an amorphous semiconductor layer is crystallized using a metal oxide. By forming a metal oxide layer below the amorphous semiconductor layer, problems that may occur due to metallic pollution may be reduced or prevented after the crystallization of the amorphous semiconductor layer. Even if the metal oxide layer remains, the remaining metal oxide layer may act as an insulator and an operation of the semiconductor device is not badly influenced by the metal oxide layer. Also, after the crystallization of the amorphous semiconductor layer, a metal silicide produced at a surface of the amorphous semiconductor layer may reduce a contact resistance between a stacked structure formed on a polycrystalline semiconductor layer and the polycrystalline semiconductor layer. By forming the polycrystalline semiconductor layer using the metal oxide, a semiconductor device that has relatively high field effect mobility and that operates at relatively high speeds may be manufactured.

To assist understanding of the inventive concepts, a semiconductor device and a polycrystalline semiconductor layer using a metal oxide according to example embodiments have been described above with reference to embodiments set forth in the drawings. However, it would be appreciated by those of ordinary skill in the art that changes may be made in example embodiments without departing from the principles and spirit of the inventive concepts, the scope of which is defined in the claims and their equivalents.

It should be understood that example embodiments described therein should be considered in a descriptive sense only and not for purposes of limitation. Descriptions of features or aspects within each embodiment should typically be considered as available for other similar features or aspects in other embodiments.

What is claimed is:

1. A semiconductor device comprising:
    a polycrystalline semiconductor layer on a substrate, the polycrystalline semiconductor layer excluding a metal;
    a metal silicide on a surface of the polycrystalline semiconductor layer; and
    a metal oxide layer between the substrate and the polycrystalline semiconductor layer,
    wherein the polycrystalline semiconductor layer has a (111) crystallization orientation during crystallization using the metal oxide layer and the polycrystalline semiconductor layer.

2. The semiconductor device of claim 1, further comprising:
    an insulating layer between the substrate and the polycrystalline semiconductor layer.

3. The semiconductor device of claim 1, wherein the insulating layer is one of $SiO_2$ and $SiN_x$, wherein 0<x<1.4.

4. The semiconductor device of claim 1, wherein the substrate is one of a glass substrate and a silicon substrate.

5. The semiconductor device of claim 1, wherein the metal oxide layer is one of NiO, CuO, ZnO, SnO, $AlO_x$, $TiO_x$, $InO_x$, $GaO_x$, $PbO_x$, and $CoO_x$.

6. The semiconductor device of claim 1, wherein the polycrystalline semiconductor layer includes one of Si, Ge, and $Si_{1-x}Ge_x$, wherein 0<x<1.

7. The semiconductor device of claim 1, wherein the polycrystalline semiconductor layer excludes a metal silicide as part of the polycrystalline semiconductor layer.

* * * * *